United States Patent
Lin et al.

(10) Patent No.: US 7,420,417 B2
(45) Date of Patent: Sep. 2, 2008

(54) TWO-PORT DUAL-GATE HEMT FOR DISCRETE DEVICE APPLICATION

(75) Inventors: Cheng-Kuo Lin, Tao Yuan Shien (TW);
Wei-Der Chang, Tao Yuan Shien (TW);
Yu-Chi Wang, Tao Yuan Shien (TW)

(73) Assignee: Win Semiconductors Corp., Tao Yuan Shien (TW)

( * ) Notice: Subject to any disclaimer, the term of this patent is extended or adjusted under 35 U.S.C. 154(b) by 183 days.

(21) Appl. No.: 11/446,204

(22) Filed: Jun. 5, 2006

(65) Prior Publication Data

US 2007/0290762 A1    Dec. 20, 2007

(51) Int. Cl.
*H03F 3/16* (2006.01)
(52) U.S. Cl. .................................. 330/277; 330/296
(58) Field of Classification Search ................ 330/277, 330/285, 296, 311
See application file for complete search history.

(56) References Cited

U.S. PATENT DOCUMENTS

| 4,264,981 | A | * | 4/1981 | Vilimek | 455/333 |
| 4,849,710 | A | * | 7/1989 | Vo | 330/277 |
| 6,515,547 | B2 | * | 2/2003 | Sowlati | 330/311 |
| 7,187,238 | B2 | * | 3/2007 | Thalhammer | 330/277 |

* cited by examiner

*Primary Examiner*—Henry K Choe
(74) *Attorney, Agent, or Firm*—Bacon & Thomas, PLLC

(57) ABSTRACT

A two-port dual-gate field-effect transistor for amplifier applications, wherein a self-bias circuit includes a number of passive elements, such as resistors, diodes and capacitors, is utilized to coupled the output of the amplifier with a second gate of the dual-gate device as a bias source, which transforms the conventional three-port cascade topology into a two-port dual-gate device so as to facilitate device testing, modeling, and packaging for discrete device application. The technology improves the RF performance in conventional two-port single-gate HEMT devices, with slight noise figure degradation.

4 Claims, 4 Drawing Sheets

Gate Length = 0.5-um
Device Size = 2 x 75 um
$V_{ds}=3V$, $I_{ds}=8$ mA, Frequency=5 GHz

| Device Type | NF (dB) | Gain (dB) | Rn (Ohms) | $\Gamma_{opt}$ |
|---|---|---|---|---|
| Sigle-gate pHEMT | 1.06 | 14.39 | 32.5 | 0.65∠21.1 |
| Two-port dual-gate pHEMT | 0.97 | 19.77 | 29.5 | 0.62∠21.4 |

FIG. 4

TWO-PORT DUAL-GATE HEMT FOR DISCRETE DEVICE APPLICATION

FIELD OF THE INVENTION

The present invention relates generally to a dual-gate amplifier, and more particularly to a design of dual-gate HEMT devices, which transforms the conventional three-port cascode topology into a two-port dual-gate device so as to facilitate device testing, modeling, and packaging.

BACKGROUND OF THE INVENTION

An amplifier is an important device commonly used in the transceiver module in various wireless communications, including cellar and satellite communications, as well as wireless local area network. A typical amplifier is implemented utilizing a signal-gate and dual-gate field-effect transistor (FET) device, such as a high-electron mobility transistor (HEMT) device or a pseudomorphic HEMT (pHEMT) device, as a transconductance amplifier. As to the dual-gate device, an input radio-frequency (RF) signal is applied to a first gate of the dual-gate FET device. The amplified signal is then drawn from the drain electrode of the dual-gate FET. A DC bias voltage is applied to a second gate of the dual-gate FET, so that the device gain can be controlled. It noteworthy that not only the input RF signal but also the noise would be amplified in the input stage, so that both the gain performance and the noise figure are important considerations for such amplifiers.

It has shown that conventional dual-gate HEMT device demonstrates excellent microwave gain performance, due to its high output resistance and low feedback capacitance, as compared with single-gate HEMT devices. However, the three-port cascode topology of a dual-gate device, which requires another DC bias from an external voltage source, further complicating the device testing and modeling, and isn't suitable for packaging mold of two-port single-gate discrete microwave device.

In order to facilitate device testing, modeling, and packaging without modification of the baseline of single-gate HEMT epi-structure, there is a need for developing a dual-gate HEMT device, which transforms the conventional three-port cascode topology into a two-port dual-gate device.

SUMMARY OF THE INVENTION

The present invention features the new device topology of three-port dual-gate field-effect transistor combine with passive elements such as capacitance and resistor, which transforms into a two-port dual-gate device so as to easy testing, modeling and packaging for discrete device application.

The present invention utilizes the drain dc bias with high resistance bias circuit for second gate bias voltage so as to obtain excellent microwave performance without another independent DC bias and don't occupy extra area.

A two-port dual-gate amplifier according to the present invention comprises a dual-gate field-effect transistor device and a self-bias circuit, wherein said dual-gate field-effect transistor device has a first gate as an input port of the amplifier for receiving RF input signal, a second gate for applying gate bias and a drain as a output port of the amplifier for providing amplified output signal; and said self-bias circuit, which is electrically coupled the output port of the amplifier with the second gate of the dual-gate transistor, provides gate bias without any external bias.

BRIEF DESCRIPTION OF DRAWINGS

FIG. 4 lists the measured gains (dB) and noise figures (dB) for the conventional single-gate HEMT and the two-port dual-gate HEMT of an embodiment in accordance with the present invention under a drain-to-source current $I_{ds}$=8 mA and a drain-to-source voltage $V_{ds}$=3V.

DETAILED DESCRIPTION OF THE INVENTION

Figure 1:
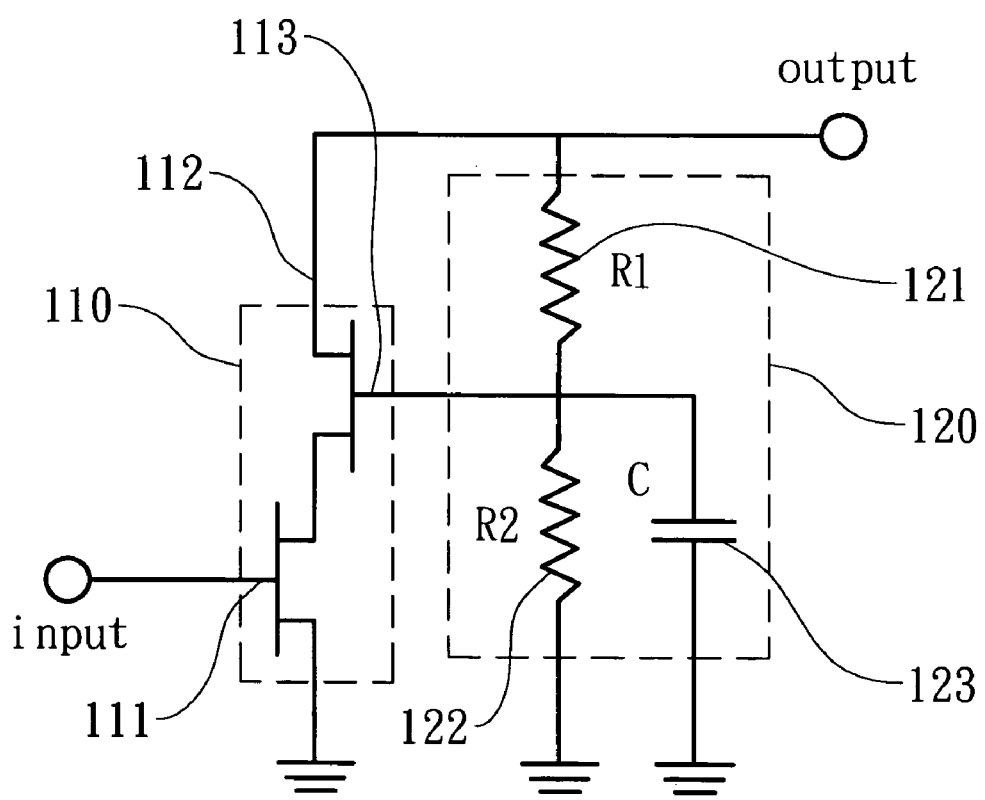
FIG. 1 illustrates a schematic of a two-port dual-gate amplifier of an embodiment according to the present invention.

FIG. 1 depicts a schematic of a two-port dual-gate low-noise amplifier 1 according to the present invention. The amplifier 1 generally comprises a dual-gate FET device 110 and a self-bias circuit 120 that reduces the conventional three-port topology of a dual-gate device into a two-port configuration. The dual-gate FET device can be a HEMT device or a preferable pHEMT device.

The dual-gate FET device 110 has a first gate 111 as an input port of the amplifier for receiving an input RF signal. The amplified output signal can be drawn from the drain electrode 112 of the dual-gate FET device 110. The self-bias circuit 120 electrically couples the output port of the amplifier with a second gate 113 of the dual-gate FET device 110 for providing gate bias without another independent DC bias voltage source.

Figure 2:
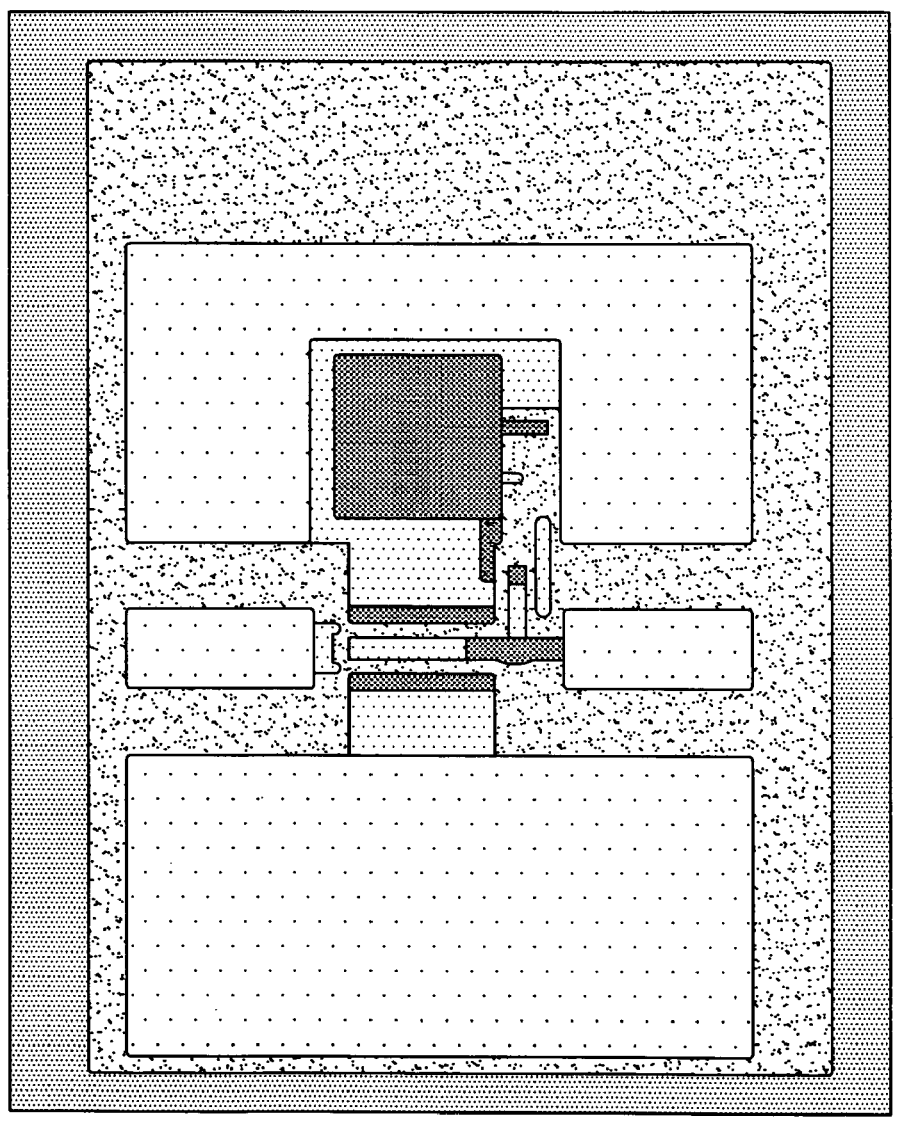
FIG. 2 is a top-view optical micrograph of a two-port dual-gate HEMT device of an embodiment in accordance with the present invention.

The self-bias circuit 120 comprises a number of passive elements, including two resistors $R_1$ 121 and $R_2$ 122, and a shunt capacitor C 123. The two resistors 121 and 122 are electrically connected in series with one terminal connected to the output port of the amplifier and the other terminal connected to ground, serving as a voltage divider. The node between the two resistors 121 and 122 is electrically connected to the second gate 113 of the amplifier so that output signal, in turn, provides a bias voltage to the dual-gate FET device 110 via the self-bias circuit 120. The shunt capacitor C 123 was used as a AC ground for second gate 113. Since the two-port dual-gate amplifier doesn't need another independent DC bias voltage source, the size for a discrete device can be minimized. A practical device layout in accordance with the present invention is shown in FIG. 2.

Figure 3:
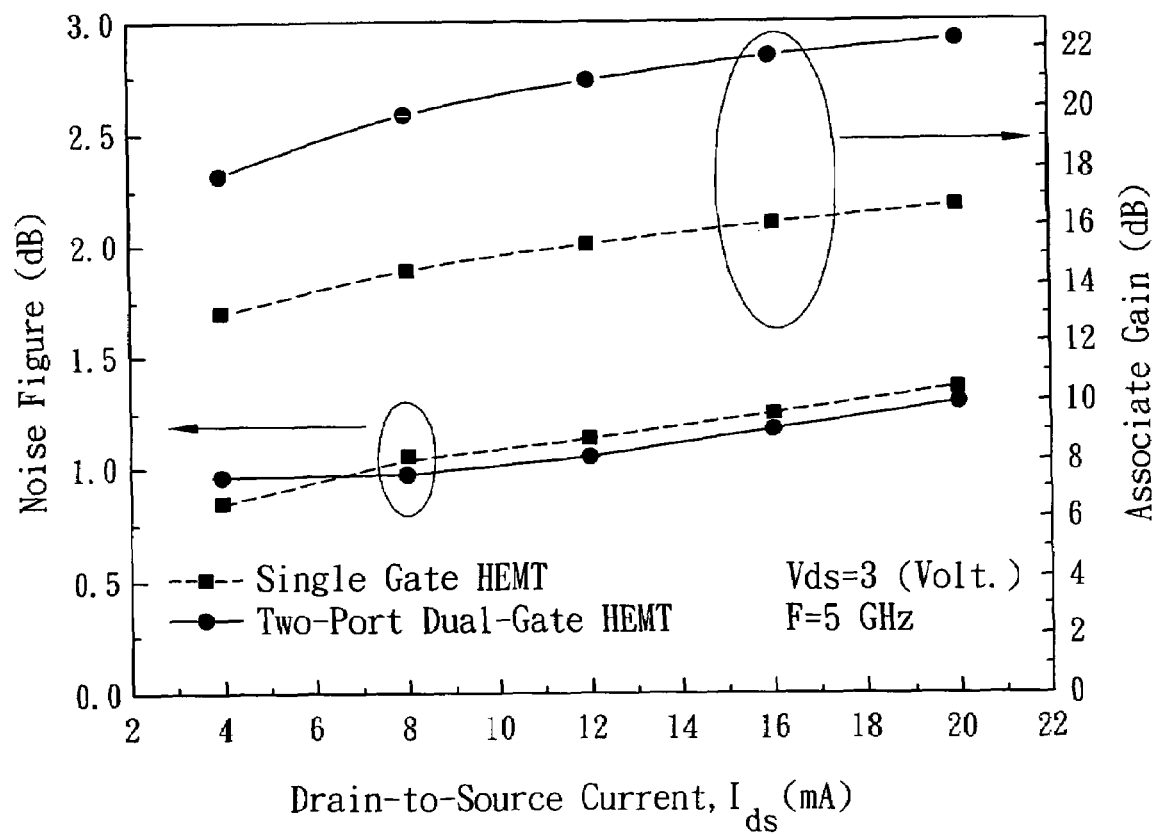
FIG. 3 displayed the measured gain and noise figure as a function of drain-to-source current under a test frequency of 5 GHz for a conventional single-gate HEMT and a two-port dual-gate HEMT of an embodiment in accordance with the present invention.

The present invention utilizing the drain output, via a self-bias circuit with high resistance therein, to bias the second gate of the dual-gate device, can provide a very high gain with a low noise figure. To demonstrate the excellent RF performance, of the device, we have experimentally compared a two-port dual-gate HEMT amplifier fabricated in accordance with the present invention and a conventional single-gate HEMT amplifier. The gate length and device area for both devices are L=0.5 μm and A=2×75 μm², respectively. FIG. 3 displayed the measured gain (G) and noise figure (NF) as a function of drain-to-source current $I_{ds}$ under a test frequency of f=5 GHz for the conventional single-gate HEMT and the two-port dual-gate HEMT. The typical gain for the single-gate HEMT is in the range from 13 to 17 dB, with a noise figure around 1 dB. By contrast, the two-port dual-gate HEMT shows significantly higher gains, ranging from 18 to 22 dB, while the noise figures are still around 1 dB. The measured gains (dB) and noise figures (dB) for the conventional single-gate HEMT and the two-port dual-gate HEMT with $I_{ds}$=8 mA and $V_{ds}$=3V are listed in the table shown in FIG. 4.

The advantages of this invention are threefold: First, this technology considerably improves the RF performance of conventional two-port single-gate HEMT device, with slightly noise figure degradation. Second, this innovation doesn't require complicated RF testing and modeling as compared with conventional dual-gate devices. Finally, the two-port discrete device packaging mold can be easily extended to low noise block market applications.

What is claimed is:

1. A two-port dual-gate amplifier, comprising:
   a dual-gate field-effect transistor device, having a first gate as a input port of the amplifier for receiving RF input signal, a second gate for applying gate bias, and a drain as a output port of the amplifier for providing amplified output signal; and
   a self-bias circuit, electrically coupled the output port of the amplifier with the second gate of the dual-gate transistor for providing gate bias without any external bias, the self-bias circuit including two resistive components electrically connected in series as a voltage divider, with one terminal connected to the output port of the amplifier and the other terminal connected to ground, a mode between the two resistive components being connected to the second gate of the amplifier, and a shunt capacitor connected from the node of the voltage divider to ground.

2. The amplifier according to claim 1, wherein the resistances of the two resistive components are in a range from 2 kΩ to 10 kΩ, and the capacitance of the shunt capacitor is in a range from 2 pF to 10 pF, such that the amplifier provides a gain of about 20 dB and a noise figure less than about 1 dB.

3. The amplifier according to claim 1, wherein the dual-gate field-effect transistor device is a high electron mobility transistor (HEMT) device.

4. The amplifier according to claim 3, wherein the HEMT device comprises a pseudomorphic HEMT device.

* * * * *